United States Patent [19]

Mitome et al.

[11] Patent Number: 5,790,258
[45] Date of Patent: Aug. 4, 1998

[54] POSITION DETECTING DEVICE

[75] Inventors: Noriyuki Mitome; Hideki Ina, both of Utsunomiya, Japan

[73] Assignee: Canon Kabushiki Kaisha, Tokyo, Japan

[21] Appl. No.: 883,585

[22] Filed: Jun. 26, 1997

Related U.S. Application Data

[63] Continuation of Ser. No. 558,764, Nov. 15, 1995, abandoned, which is a continuation of Ser. No. 200,664, Feb. 23, 1994, abandoned.

[30] Foreign Application Priority Data

Feb. 26, 1993 [JP] Japan ................. 5-063247

[51] Int. Cl.$^6$ ........................................ G01B 11/00
[52] U.S. Cl. ............................ 356/401; 356/375
[58] Field of Search ............................ 356/399–401, 356/375; 355/43, 52; 359/368; 250/548, 559.3

[56] References Cited

U.S. PATENT DOCUMENTS

| | | | |
|---|---|---|---|
| 4,645,924 | 2/1987 | Suzuki et al. | 250/236 |
| 4,669,883 | 6/1987 | Ina et al. | 356/401 |
| 4,672,557 | 6/1987 | Tamura et al. | 356/401 X |
| 4,777,374 | 10/1988 | Nakata et al. | 356/401 |
| 4,834,540 | 5/1989 | Totsuka et al. | 356/401 |
| 4,861,162 | 8/1989 | Ina | 356/401 |
| 4,883,359 | 11/1989 | Ina et al. | 356/401 |
| 4,886,974 | 12/1989 | Ina | 356/450 X |
| 4,901,109 | 2/1990 | Mitome et al. | 355/53 X |
| 5,050,111 | 9/1991 | Ayata et al. | 356/400 X |
| 5,114,235 | 5/1992 | Suda et al. | 356/401 |
| 5,133,603 | 7/1992 | Suzuki et al. | 356/400 |
| 5,137,363 | 8/1992 | Kosugi et al. | 356/401 |
| 5,276,550 | 1/1994 | Kojima | 359/368 |

FOREIGN PATENT DOCUMENTS

| | | |
|---|---|---|
| 62-232504 | 10/1987 | Japan . |
| 361802 | 3/1991 | Japan . |

OTHER PUBLICATIONS

Yamanaka et al "NA and δ Optimization for High NA I–Line Lithography", SPIE vol. 1927 1993. pp. 310–319.

*Primary Examiner*—K. Hantis
*Attorney, Agent, or Firm*—Fitzpatrick, Cella, Harper & Scinto

[57] ABSTRACT

A position detection device for detecting the position of an object includes a light source for generating light, an illumination device introducing the light from the light source to the object, and a detector for detecting the position of the object on the basis of a sensed optical image. The detection device further includes an image forming optical system for forming the image of the object on a detection surface of the detector at a first magnification. The device also includes an optical member insertable into and retractable from an optical path of the light travelling from the object to the detector. Insertion of the optical member into the optical path allows the light from the object which has been passed through at least part of the optical member and the image forming optical system to form the image of the object on the detection surface of the detector at a second magnification smaller than the first magnification.

20 Claims, 8 Drawing Sheets

POSITION DETECTING DEVICE

This application is a continuation, of Application No. 0/558,764 filed Nov. 15, 1995, now abandoned which is a continuation of 08/200,664 filed Feb. 23, 1994 now abandoned.

BACKGROUND OF THE INVENTION

1. Field of the Invention

The present invention relates to a position detecting device and a method of transferring a pattern on a reticle to a wafer devices using the same. The position detecting device is suitable for use in, for example, a projection exposure apparatus (stepper) employed in the manufacture of semiconductor devices. That is, the position detecting device is suitably used to perform a relative alignment (position detection) between a first object, such as a reticle or a mask, and a second object, such as a wafer, when an electronic circuit pattern formed on the surface of the first object is projected and transferred onto the surface of the second object by means of a projection lens (a projection optical system) in that projection exposure apparatus.

2. Description of the Related Art

In a projection exposure apparatus for use in the manufacture of semiconductor devices, one of the most important factors for achieving a highly accurate exposure is an accurate relative alignment between the reticle and the wafer. In recent years, IC (integrated circuit) complexity has advanced, and thus there has been a demand for alignment accuracy in the range of a sub-micron or less. Various alignment methods between the reticle and the wafer have been proposed. The following three alignment methods are examples of such methods.

(1-1) One alignment method employs exposure radiation which is passed through a projection lens (exposure radiation TTL method)

(1-2) A second alignment method employs non-exposure radiation which is not passed through the projection lens (OFF-AXIS method)

(1-3) A third alignment method employs non-exposure radiation which is passed through the projection lens (non-exposure radiation TTL method)

Steppers employing, as the exposure radiation, i radiation (wavelength) which is drawing attention presently, are called i radiation steppers. Such i radiation steppers employ the non-exposure radiation TTL method identified above as (1-3) as the optimal alignment method from the viewpoint of the resist characteristics, the stability of the base lines and the scale of the apparatus.

The present inventors have already proposed a position detecting device utilizing the (1-3) method and a method of manufacturing semiconductor devices employing such a position detecting device in Japanese patent Laid-Open No. hei 3-61802.

In addition, the present inventors have proposed, in Japanese Patent Laid-Open No. sho 62-232504, a projection exposure apparatus in which the image of an alignment mark on the surface of a wafer is formed on the detecting surface of imaging means and in which position detection is performed from the image data obtained by the imaging means using a technique of, for example, pattern matching.

In a method of aligning the reticle to the wafer of the type in which an optical image of an alignment mark formed on the wafer is formed on an imaging element, such as a CCD camera, by means of a detection system, and in which the electrical signal obtained by the imaging element is processed to detect the position of the wafer mark, a detection resolution R of the wafer mark is determined by the ratio of the pitch of the imaging element to the optical magnification of the detection system.

Assuming that the wafer mark is formed on a CCD camera having an imaging element of 13 µm pitch with a detecting system at an optical magnification of 100×, the detection resolution $R_{100}$ is obtained as follows:

$$R_{100}=13/100=0.13 \text{ µm/Pix}$$

Although the reproduction accuracy differs depending on the processing method, it is in general proportional to the resolution, and is from 1/5 to 1/10 thereof (which is from 26 to 13 nm in this case).

Thus, in order to increase the reproduction accuracy, the pitch of the imaging element must be reduced, or the optical magnification of the detection system must be increased. However, the manufacture of imaging elements having a smaller pitch is very difficult.

An increase in the optical magnification of the detection system encounters the following problems:

(2-1) a reduction in the intensity of light (in proportion to the square of the optical magnification); and (2-2) a reduction in the detection range (in proportion to the optical magnification).

Even if an imaging element having the smallest pitch (13 µm) in those of the presently mass produced CCD cameras is used, the optical magnification employed at that time is 100X or below due to the reflectivity of the wafer and the shape of the wafer mark, inhibiting an increase in the alignment accuracy.

SUMMARY OF THE INVENTION

It is an object of the present invention to overcome the problems of the prior art.

It is another object of the present invention to provide a position detecting device used in the manufacturer of semiconductor devices having high reproduction accuracy and high alignment accuracy.

It is still another object of the present invention to provide a position detecting device capable of performing relative alignment between a reticle and a wafer with a high degree of accuracy by forming the image of an alignment mark (formed on the surface of the wafer) on the surface of an imaging element aligned with respect to the reticle in advance by a detection system through a projection optical system at an adequate image forming magnification, thereby detecting the position of the alignment mark.

According to one aspect, the present invention which achieves one or more of these objectives relates to a position detection device for detecting a position of an object. The device comprises a light source for generating light, an illumination device introducing the light from the light source to the object, and a detector for detecting the position of the object on the basis of a sensed optical image. The device further comprises an image forming optical system for forming the image of the object on a detection surface of the detector at a first magnification. The device further comprises an optical member insertable into and retractable from an optical path of light travelling from the object to the detector. The insertion of the optical member into the optical path allows the light from the object which has been passed through at least part of the optical member and the image forming optical system to form the image of the object on the detection surface of the detector at a second magnification smaller than the first magnification.

The device further comprises a cylindrical lens, and the detector can comprise a one-dimensional sensor for receiving light passing through the cylindrical lens. In addition, the optical member can comprise a lens. In this embodiment, the optical member and the image forming optical system form the image of the object at the second magnification on the same detection surface as that at which the image is formed at the first magnification. Moreover, the detector can have first and second detection surfaces. In this embodiment, the image of the object formed at the first magnification is formed on the first detection surface and the image of the object which is formed at the second magnification is formed on the second detection surface. In addition, the optical system can comprise a mirror, and the image forming optical system can comprise a polarization beam splitter. The optical member can also comprise a halfwave plate inserted into the optical path to receive light from the object before the light enters the polarization beam splitter.

According to another aspect, the present invention which achieves one or more of these objectives relates to a position detecting method for detecting a position of an object. The method comprises a light generating step of generating light with a light source, an illumination step of introducing the light from the light source to the object, and a first detection step of detecting the position of the object by forming the image of the object on a detection surface of a detector at a first magnification with an image forming optical system. The method also comprises the step of inserting an optical member into an optical path of the light travelling from the object to the detector. The light from the object which has been passed through at least part of the optical member and the image forming optical system form the image of the object on the detection surface of the detector at a second magnification which is smaller than the first magnification. The method further comprise a second detection step of detecting the position of the object from the image of the object formed on the detection surface of the detector at the second magnification.

The first detection step can comprise a step of receiving light from the object with a cylindrical lens and transmitting the light from the object through the cylindrical lens to a detection surface of a one-dimensional sensor.

The optical member can comprise a lens. In this embodiment, the second detecting step comprises the step of forming with the optical member and the image forming optical system the image of the object at the second magnification on the same detection surface as that at which the image is formed at the first magnification.

The detector can have first and second detection surfaces. In this embodiment, the first detection step comprises the step of forming the image of the object at the first magnification on the first detection surface, and wherein the second detection step comprises the step of forming the image of the object at the second magnification on the second detection surface.

The optical member can have a mirror in one embodiment. In this embodiment, the inserting step comprises the step of reflecting light from the object to the detector.

In addition, the image forming optical system can have a polarization beam splitter. In this embodiment, the first detection step comprises the step of transmitting light from the object to the detector through the polarization beam splitter. In addition, the optical member can comprise a halfwave plate. In this embodiment, the inserting step can comprise the step of inserting the halfwave plate in the optical path on the side of the polarization beam splitter closer to the object.

According to another aspect, the present invention which achieves one or more of these objectives relates to an exposure apparatus for detecting a position of a mark formed on a wafer and for projecting a pattern on a reticle onto the wafer. The apparatus comprises a working stage for supporting the wafer thereon, a light source for generating light, and an illumination device for introducing the light from the light source to the mark. The apparatus further comprises a detector for detecting the position of the object on the basis of a sensed optical image, and an image forming optical system for forming the image of the mark on a detection surface of the detector at a first magnification. The apparatus further comprises an optical member insertable into and retractable from an optical path of the light travelling from the mark to the detector. Insertion of the optical member into the optical path allows the light from the mark which has been passed through at least part of the optical member and the image forming optical system to form the image of the mark on the detection surface of the detector at a second magnification smaller than the first magnification. The apparatus further comprises a control system controlling the working stage to move the wafer to a predetermined position on the basis of the position of the wafer obtained by the detector and transferring the pattern on the reticle onto the wafer.

According to another aspect, the present invention which achieves one or more of these objectives relates to an exposure method of detecting a position of a mark formed on a wafer and of projecting a pattern on a reticle onto the wafer. The method comprises a light generating step of generating light with a light source, an illumination step of introducing the light from the light source to the mark, and a first detection step of detecting the position of the mark by forming an image of the mark on a detection surface of a detector at a first magnification with an image forming optical system. The method further comprises a step of inserting an optical member into an optical path of the light travelling from the mark to the detector. The light from the mark which has been passed through at least part of the optical member and the image forming optical system forms the image of the mark on the detection surface of the detector at a second magnification which is smaller than the first magnification. The method further comprises a second detection step of detecting the position of the mark from the image of the mark formed on the detection surface of the detector at the second magnification. The method also comprises the step of moving the wafer to a redetermined position on the basis of a position of the wafer obtained in the first and second detection steps and of transferring the pattern on the reticle onto the wafer.

According to still another aspect, the present invention which achieves one or more of these objectives relates to a method of transferring a pattern on a reticle to a wafer devices by detecting a position of a mark on a wafer and by protecting a pattern on a reticle onto the wafer. The method comprises a light generating step of generating light with a light source, an illumination step of introducing the light from the light source to the mark, and a first detection step of detecting the position of the mark by forming an image of the mark on a detection surface of a detector at a first magnification with an image forming optical system. The method further comprises a step of inserting an optical member into an optical path of the light travelling from the mark to the detector. The light from the mark which has been passed through at least part of the optical member and the image forming optical system forms the image of the mark on the detection surface of the detector at a second magnification which is smaller than the first magnification. The method further comprises a second detection step of detecting the position of the mark from the image of the mark formed on the detection surface of the detector at the second magnification. In addition, the method comprises the step of moving the wafer to a predetermined position on the basis of a position of the wafer obtained in the first and second detection steps and of transferring the pattern on the reticle onto the wafer.

The above and further features and advantages of the present invention will become apparent from the following detailed description of preferred embodiments when taken in conjunction with the accompanying drawings.

DETAILED DESCRIPTION OF THE PREFERRED EMBODIMENTS

Figure 1:
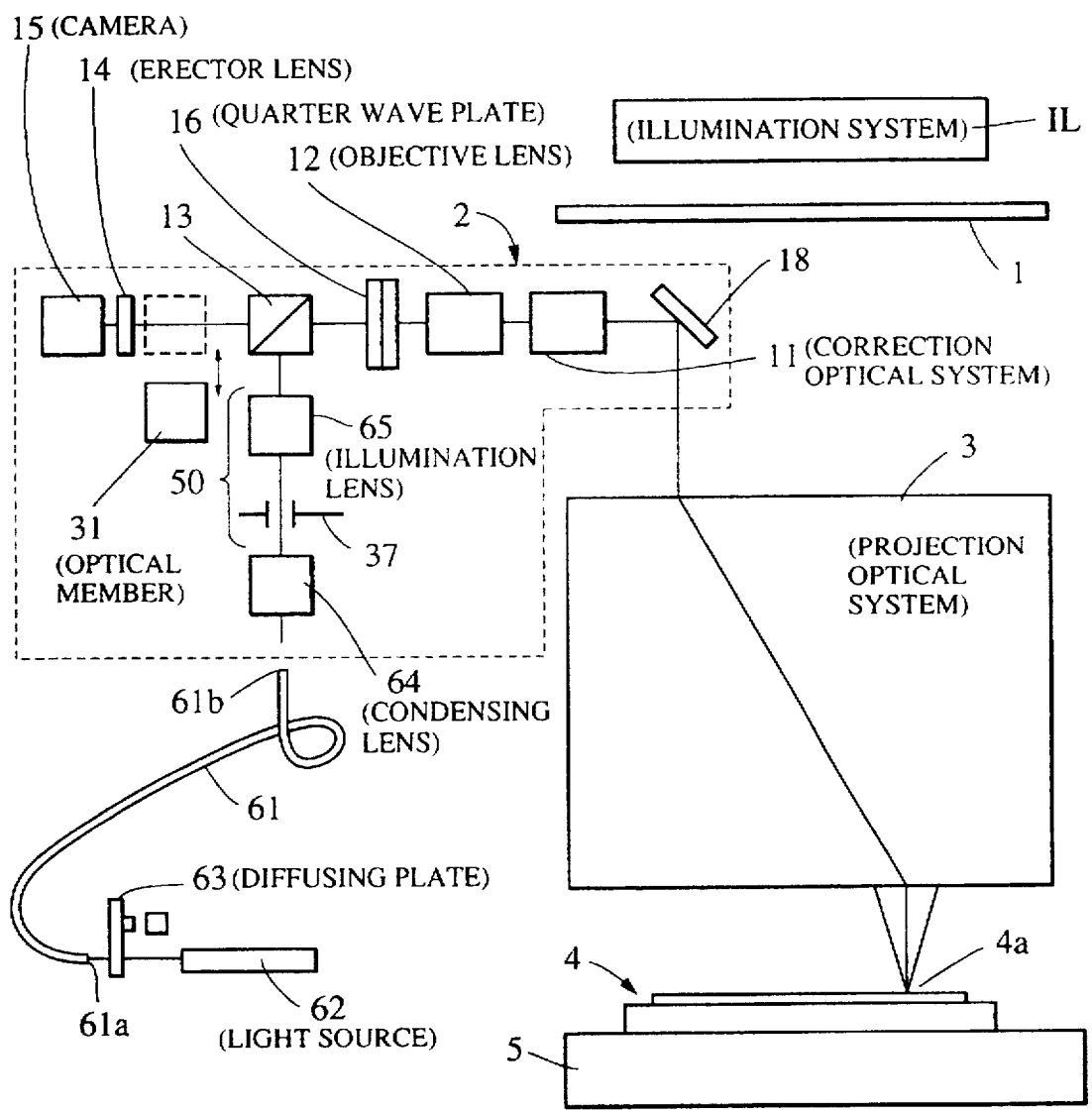
FIG. 1 is a schematic block diagram of the essential parts of a first embodiment of the present invention.

FIG. 1 is a schematic view of the essential parts of a first embodiment of the present invention in which the position detecting device according to the present invention is applied to a projection exposure apparatus for use in the manufacture of semiconductor devices.

In this embodiment, an electronic circuit pattern formed on a reticle (mask) 1 illuminated with exposure radiation from an exposure illumination system IL is projected onto and transferred to a wafer 4 placed on a two-dimensionally movable stage 5 through a projection optical system 3. The surface of the wafer 4 is a resist-coated surface. The exposed resist on the wafer 4 is subjected to a known developing process, whereby semiconductor devices are manufactured.

In this embodiment, prior to that exposure operation, relative alignment between the reticle 1 and the wafer 4 is performed. This relative alignment between the reticle 1 and the wafer 4 is performed by detecting the positional data on an alignment mark (also called a wafer mark) on the surface of the wafer 4 with a detection system 2.

This alignment method will be described.

A light source 62 generates a light beam having a wavelength different from that of the exposure radiation. The light source may be a He—Ne laser. A rotational diffusing plate 63 diffuses the light beam from the light source 62 and thereby introduces it to an incident surface 61a of a fiber 61.

A condensing lens 64 condenses the light beam emitting from an emitting surface 61b of the fiber 61. An aperture-stop 37 adjusts the amount of the light beam, and an illumination lens 65 condenses the light beam passed through the aperture-stop 37. The condensed light beam enters a polarization beam splitter 13. Element 37 and 65 constitute an illumination system 50.

The aperture-stop 37 is used to adjust σ of the illumination system, as will be described later.

The light beam reflected by the polarization beam splitter 13 passes through a quarter wave plate 16, an objective lens 12, and then a correction optical system 11, is reflected by a mirror 18, and then illuminates the alignment mark 4a on the surface of the wafer through the projection optical system 3.

Figure 6:
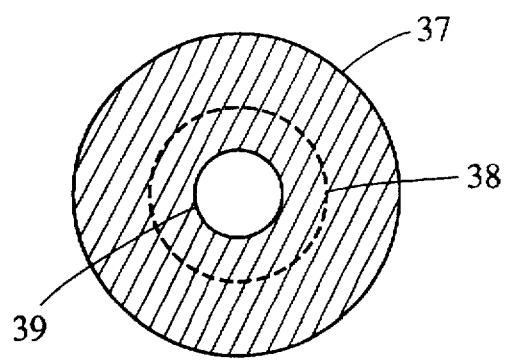
FIG. 6 illustrates a cross-sectional view of an aperture-stop shown in FIG. 1.
Figure 10A:
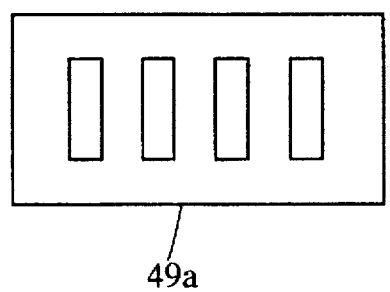
FIGS. 10(A) and 10(B) illustrate schematic front views of an alignment mark according to the present invention.
Figure 10B:
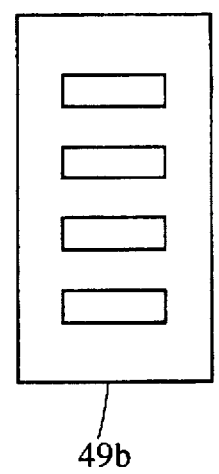

The alignment mark 4a may comprise rectangular patterns elongated in the X and Y directions, respectively, as shown in FIG. 6, or a plurality of parallel line patterns which are parallel in the X and Y directions, respectively, as show in FIGS. 10 (A) and 10 (B).

The correction optical system 11 is used to correct various lens aberrations generated when the light beam from the alignment mark 4a passes through the projection optical system 3.

The reflected light beam from the alignment mark 4a on the surface of the wafer 4 passes through the projection optical system 3, the mirror 18, the correction optical system 11, the objective lens 12, the quarter wave plate 16, the polarization beam splitter 13 and then enters an erector lens 14. The erector lens 14 forms an image of the alignment mark 4a on the imaging surface of a CCD camera 15 serving as the imaging element.

The positional relation between the imaging element or device 15 and the reticle 1 has been obtained beforehand.

An optical member 31, which may be a group of lenses or a cylindrical lens, is provided in such a manner that it can be inserted into and retracted from an optical path, whereby two optical systems are formed in order to offer two image forming magnifications, high and low magnifications, at which the alignment mark 4a is formed on the imaging element 15. These two optical systems may be used in the following manner: the position of the alignment mark 4a is first detected at a low magnification ensuring detection of a wide detection area. After the alignment mark 4a is moved to a position where the mark can be detected at a high magnification on the basis of the detected positional data, it is detected at a high magnification.

In this embodiment, the positional data on the alignment mark 4a obtained by the imaging means 15 is used to detect a relative position between the wafer 4 and the imaging element 15, i.e., a relative position between the wafer 4 and the reticle 1.

In this embodiment, the image of the alignment mark 4a is formed on the imaging element 15 at the high magnification when a first optical system is formed by retracting the optical member 31 from the optical path of light travelling from beam splitter 13 to imaging element 15, while the image is formed at the low image forming magnification when a second optical system is constituted by inserting the optical member 31 into the optical path of light travelling from beam splitter 13 to imaging element 15. The image forming magnification of the first optical system (the high magnification) is, for example, 260×, and the image forming magnification of the second optical system (the low magnification) is 65×.

In this embodiment, the detection system 2 contains a plurality of optical systems (two optical systems in this embodiment). However, it may be three or more, each having an image forming magnification different from that of the others. By utilizing a plurality of optical systems, it is possible to change the detection range for alignment and the detection resolution for the alignment mark 4a on the surface of the wafer 4.

Assuming that the pitch of the imaging forming element of the image forming element 15 is 13 µm, a detection range of ±2 µm is detected at a resolution of 0.05 µm/Pix if the first optical system (the high image forming magnification) is selected, while a detection range of ±10 µm is detected at a resolution of 0.2 µm/Pix in the second optical system (the low image forming magnification).

Figure 2:
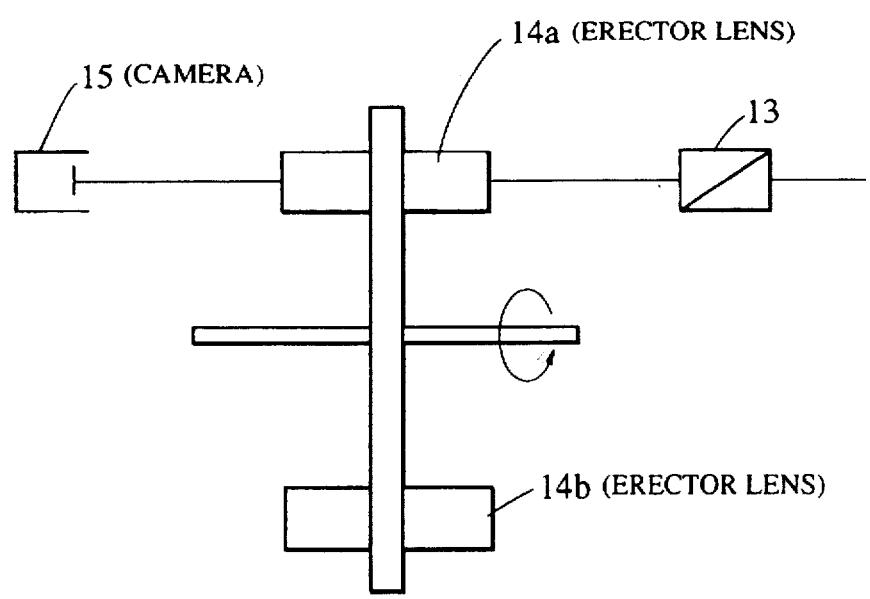
FIG. 2 illustrates a schematic view of a conventional turret type switching over device.

In this embodiment, the image forming magnification of the detection system is changed by the insertion of the optical member 31 in and retraction of the optical member 31 from the optical path. In this way, the alignment mark can be observed at the high magnification, which requires a high-precision measurement, without such an optical member inserted into the optical path. This is unlike the conventional method shown in FIG. 2, in which erector lenses 14a and 14b are inserted in and retracted from the optical path in a turreted manner.

Figure 3:
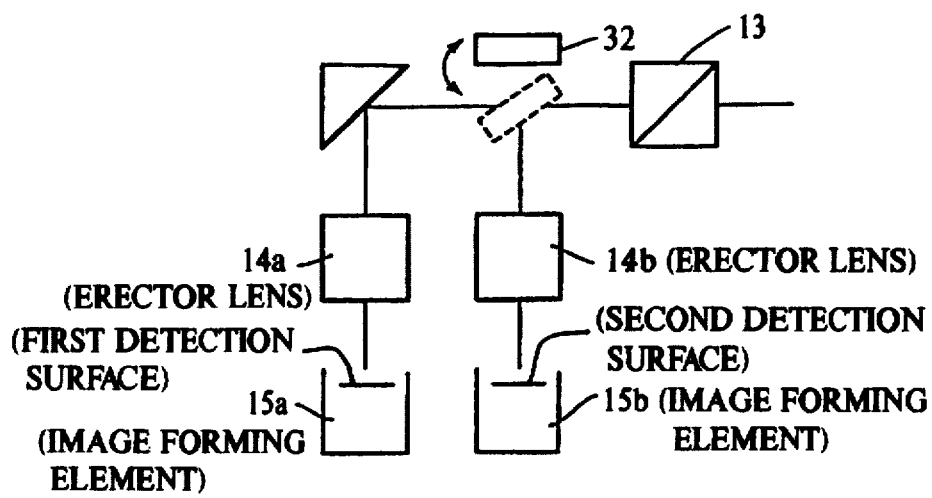
FIG. 3 is a schematic block diagram of part of a second embodiment of the present invention.
Figure 4:
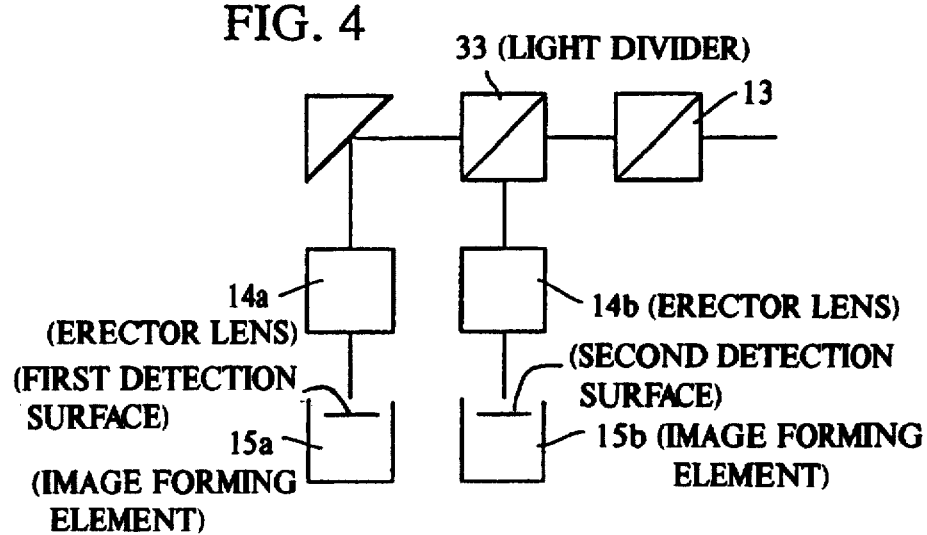
FIG. 4 is a schematic block diagram of part of a third embodiment of the present invention.
Figure 5:
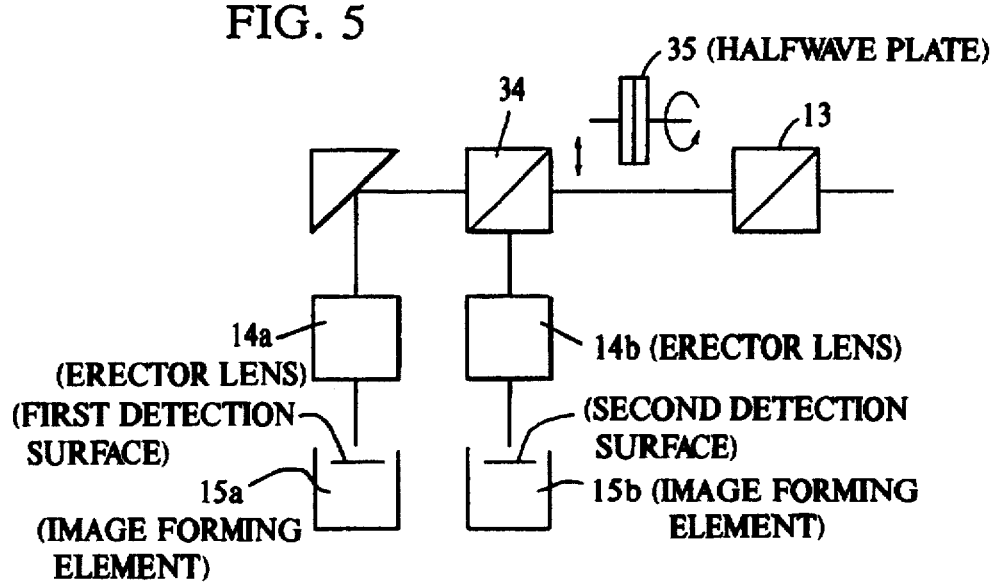
FIG. 5 is a schematic block diagram of part of a fourth embodiment of the present invention.

FIGS. 3, 4 and 5 are respectively schematic views of part of second, third and fourth embodiments of the present invention. Identical reference numerals in these figures to those in FIG. 1 represent similar or identical elements.

In the second embodiment shown in FIG. 3, a mirror 32 changes over the light beam from the polarization beam splitter 13 so that the light beam can be introduced to either of an erector lens 14a, serving as the first optical system provided for observation at a high image forming magnification, or an erector lens 14b, serving as a second optical system provided for observation at a low magnification. The image of the alignment mark 4a is formed on image forming elements 15a and 15b at different magnifications.

In the third embodiment shown in FIG. 4, a light divider 33 divides the light beam from the polarization beam splitter 13 into two light beams so that the two light beams can be respectively introduced into both an erector lens 14a, serving as the first optical member, and an erector lens 14b, serving as the second optical system.

In this embodiment, a reflectivity R1 of the light divider 33 is set to a value given by the following equation, where βH and βL are, respectively, high and low image forming magnifications:

$$R1 = \frac{\beta L2}{\beta H2 + \beta L2} \times 100\%$$

In this way, the signal level obtained by photoelectrically converting the image formed at the high image forming magnification by image forming element 15a can be made the same as the signal level obtained by photoelectrically converting the image formed at the low magnification by image forming element 15b which is the same as the image forming element 15a.

If the image forming elements 15a and 15b have different photoelectrical conversion efficiencies γH and γL, a reflectivity R2 of the light divider 33 is set to a value given by the following equation:

$$R2 = R1 \times \frac{\gamma H}{\gamma H \text{ and } \gamma L}$$

In the fourth embodiment shown in FIG. 5, a polarization beam splitter 34 is used in place of the light divider 33 which is used in the third embodiment, and a pivotal halfwave plate 35 is provided in such a manner as to be inserted into and retracted from the optical path of light travelling from beam splitter 13 to beam splitter 34.

For rough detection at a low image forming magnification, a second optical system is provided by inserting the halfwave plate 35 into the optical path. Also, the halfwave plate 35 is rotated according to the reflectivity of the wafer 4. At that time, if a p-polarized light enters the halfwave plate 35, the halfwave plate 35 emits an s-polarized light. This s-polarized light is totally reflected by the polarization beam splitter 34 and enters erector lens 14b and image forming element 15b. For high-accuracy detection at a high magnification, a first optical system is provided by retracting the halfwave plate 35 from the optical path. As a result, the light transmitted through polarization beam splitter 13 is transmitted through polarization beam splitter 34 and the erector lens 14a and enters image forming element 15a In this way, the effective usage of the light beam is achieved. In this embodiment, if the posture accuracy with which the halfwave plate 35 is rotated is high, it is not necessary for the halfwave plate 35 to be retracted from the optical path for the detection at a high magnification. An EO (Electrooptic Modulator) element, such as a titanate zirconate of lead and lanthanum (PLZT), can be used in place of the halfwave plate 35 in order to rotate the direction of polarization. In that case, if the posture accuracy is high, retraction of the PLZT is not necessary for the detection at the high magnification, as in the above-described above.

In the case where the wafer has a low reflectivity, the amount of light is increased by either of the following two methods in the first through fourth embodiments.

(3-1) The amount of light can be increased by changing the pupil of the illumination system IL (For the detection of the alignment mark in one direction alone)

(3-2) The amount of light can be increased by enlarging the detection window

Further, in order to increase the contrast of the image data from a wafer having a low shoulder, σ (=the ratio of the NA (numerical aperture) of the illumination system to the NA (numerical aperture) of the image forming and photographing system) of the illumination system is reduced.

In a practical operation, the aperture-stop 37, such as that shown in FIG. 6, is provided in the first embodiment shown in FIG. 1 in order to reduce σ of the illumination system.

In FIG. 6, a circular region 38 represents the maximum NA. The ratio of the area of the circular region 38 to the area of a circular transparent region 39 is the value σ. The amount of light is in proportion to the area of the transparent region 39 of the aperture-stop 37. In order to improve the limitation of the detection of a wafer having a low reflectivity, the area of the transparent region must be increased.

Hence, the following method may be used in this embodiment.

Figure 7:
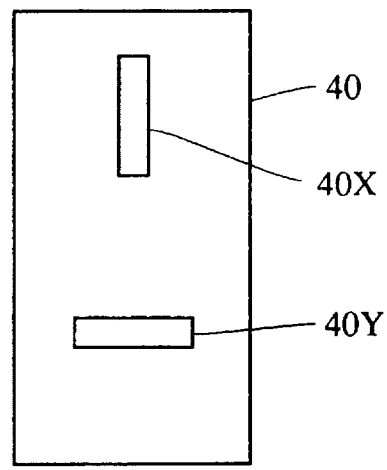
FIG. 7 illustrates a schematic front view of an alignment mark of FIG. 1.
Figure 8:
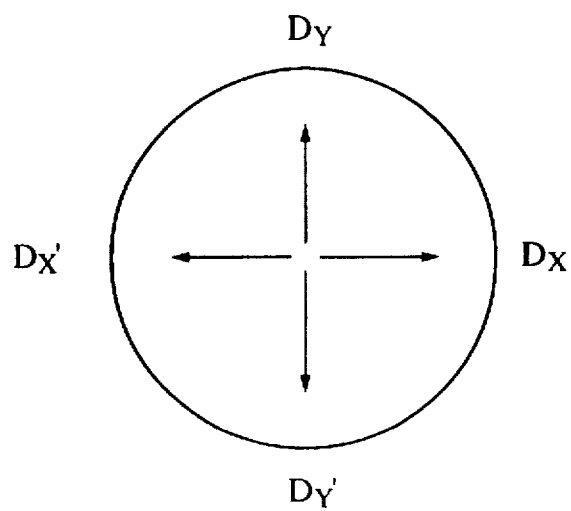
FIG. 8 illustrates the direction of alignment of FIG. 1.
Figure 9B:
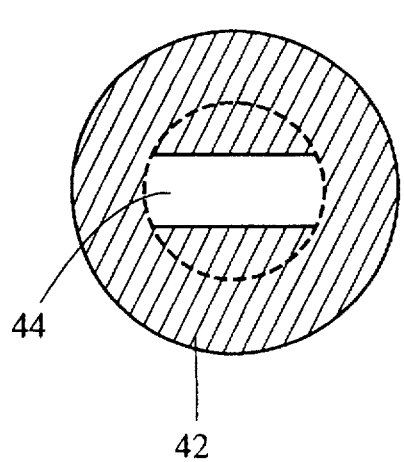
FIGS. 9(A) and 9(B) illustrate cross-sectional views of an aperture-stop according to the present invention.
Figure 9A:
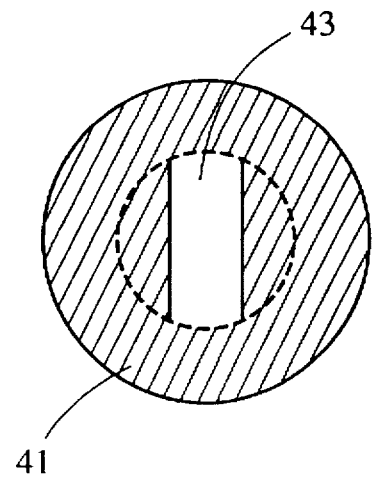

Assuming that the alignment mark is an XY mark 40 comprising marks 40X and 40Y shown in FIG. 7 and that diffracted lights $D_x$ and $D_y$ of the mark 40 are directed in directions shown in FIG. 8 on the surface of the pupil of the projection optical system 3, aperture-stops 41 and 42, respectively shown in FIGS. 9 (A) and 9 (B), are switched over in order to increase the area of each of transparent portions 43 and 44 while maintaining σ of the illumination system low. In this way, an increase in the amount of light is achieved.

In an actual operation, detection in the X direction is performed using the aperture-stop 41, and then detection in the Y direction is conducted using the aperture-stop 42. Alternatively, detection in the Y direction is performed using the aperture-stop 42, and then detection in the X direction is performed using the aperture-stop 41.

In this embodiment, the marks shown in FIGS. 10 (A) and 10 (B), 49a and 49b, respectively, may be used to improve the alignment accuracy. In that case, the alignment accuracy is improved by both the averaging effect achieved by an increase in the edge length and by improving the coverage of a photoresist on the alignment mark. In this case, the aperture-stops 41 and 42 respectively shown in FIGS. 9 (A) and 9 (B) may be switched over, as in the above-described case. The operation sequence is the same as that for the case of the XY mark 40. Also, the wafer is moved by the XY stage with an interferometer concurrently with the switch over of the aperture-stops 41 and 42.

In this embodiment, switch over of the aperture-stops 41 and 42 is eliminated if two detection systems are provided in order to separately detect the position data in the X and Y directions and if the aperture-stops 41 and 42 are disposed in respective detection systems. In that case, the use of a one-dimensional CCD sensor having a small pitch is enabled, thus improving the detection resolution.

Figure 11:
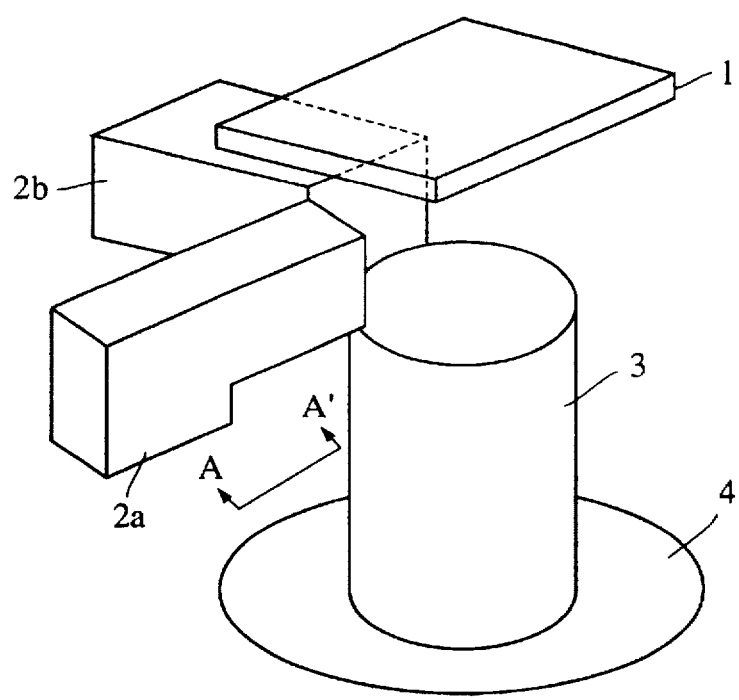
FIG. 11 is a schematic view of the essential parts of a fifth embodiment of the present invention.
Figure 12:
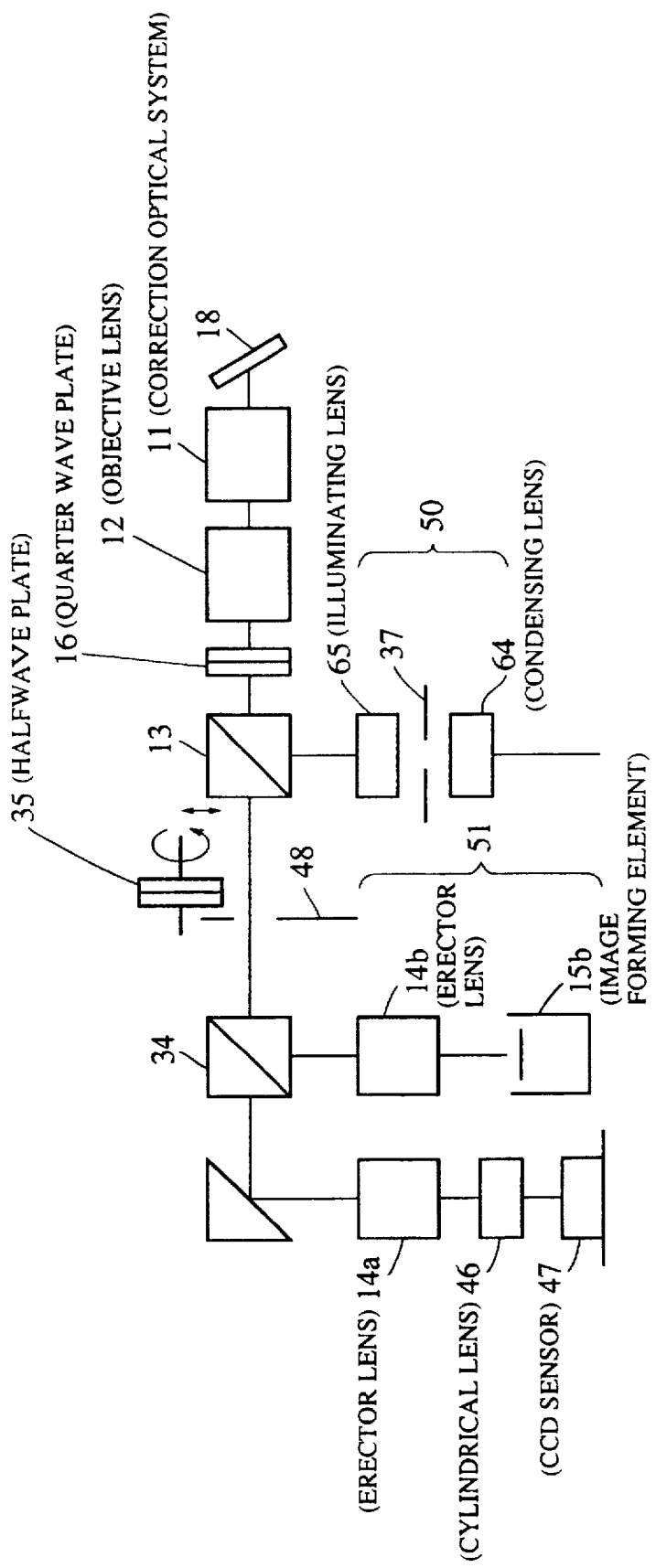
FIG. 12 is a schematic block diagram of the essential parts of a fifth embodiment of the present invention.

FIGS. 11 and 12 are schematic views showing the essential parts of a fifth embodiment of the present invention.

In this embodiment, a cylindrical lens is used as part of the detection system in order to effectively condense the light beam and thereby increase the amount of light.

In this embodiment, two detection systems 2a and 2b, which are the same as each other, are disposed above the projection optical system 3 in such a manner that they form a 90 degree angle therebetween to detect the positions in the X and Y directions, respectively.

FIG. 12 is a schematic view of the essential parts of one of the detection systems as seen when looking in the direction indicated by line A–A' in FIG. 11. Identical reference numerals in FIG. 12 to those in FIG. 1 represent similar or identical elements.

An illumination system 50 comprises the above-described aperture-stop 37, the condensing lens 64, and the illuminating lens 65. Further, the polarization beam splitter 34 is disposed in the optical path. The halfwave plate 35 is rotatable in such a manner that it can be inserted into and retracted from the optical path. An optical system 51 for the detection at a low image forming magnification comprises erector lens 14b and an image forming element 15b, for example, a two-dimensional camera.

An optical system for the detection at a high image forming magnification comprises an erector lens 14a, a cylindrical lens 46, and a one-dimensional CCD sensor 47. The positional data in the direction perpendicular to the direction of detection, which has been optically integrated by the cylindrical lens 46, is the same as that obtained by electrically integrating, using the two-dimensional camera 15, the area of the positional data which has been optically integrated by the cylindrical lens 46. When the positional data in the direction perpendicular to the direction of detection is optically integrated by the cylindrical lens 46, it is not always necessary for the image of the alignment mark to be formed on the surface of the one-dimensional CCD sensor 47.

Figure 13:
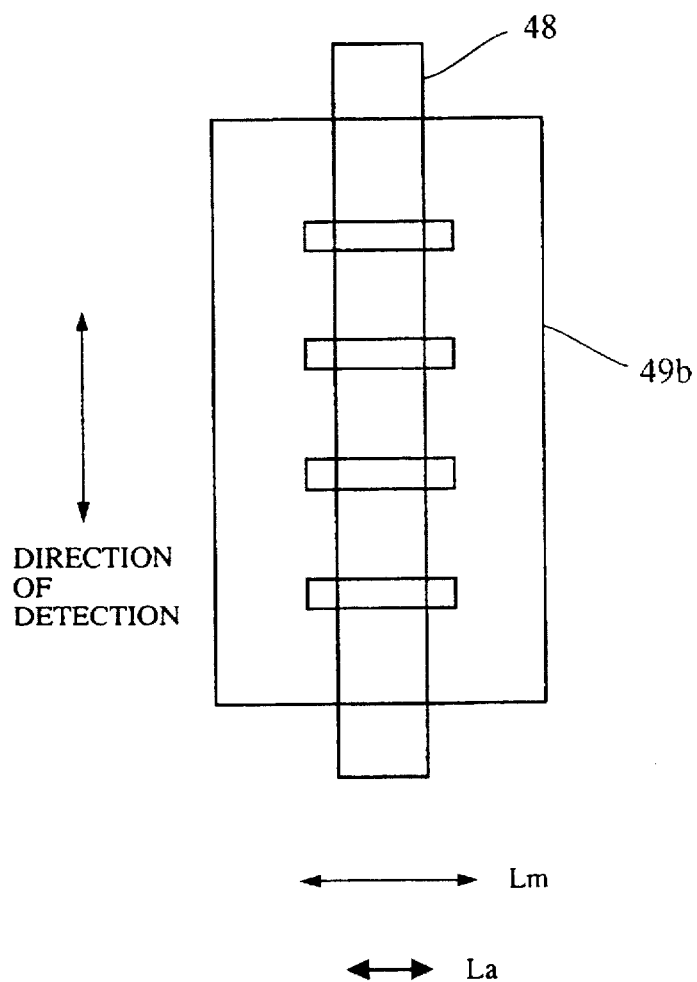
FIG. 13 illustrates a schematic front view of an alignment mark of FIG. 12.

What is required is to gather the light beam such that it enters a single pixel of the one-dimensional CCD sensor 47. In order to limit the area to be integrated, a field stop is disposed at an intermediate image position, as shown in FIG. 12. FIG. 13 shows the relation between the field stop 48 and the mark. To limit the area, a length La of the field stop 48 is made smaller than a length $L_m$ of the mark 49b in the direction perpendicular to the direction of detection.

If the one-dimensional CCD sensor 47 used at that time is of the type which has a large number of pixels and whose detection range is similar to that of the optical system for the detection at a low magnification, such as ±10 μm, the provision of the optical system for the detection at a low magnification is not necessary.

The position detection device according to the present invention can also be applied to an exposure apparatus of the exposed light TTL (through-the-lens) method or to the OFF-AXIS method.

The individual components represented by the blocks shown in FIGS. 1–5 and 12 are well known in the position detection device art and the semiconductor device manufacturing art and their specific construction and operation are not critical to the invention or the best mode for carrying out the invention. Moreover, the steps discussed in the specification can be easily programmed into well-known central processing units by persons of ordinary skill in the art and since such programming, per se, is not part of the invention, no further description thereof is deemed necessary.

Although the invention has been described with respect to the specific embodiments noted above, it is to be understood that it is not limited the specific details disclosed above and that various changes and modifications can be made within the spirit and scope of the appended claims.

What is claimed is:

1. A position detection device for detecting a position of an object, said device comprising:

a light source for generating light;

an illumination device introducing the light from said light source to the object;

detector means for detecting the position of the object on the basis of a sensed optical image by photoelectrically converting the sensed optical image to an electrical signal;

an image forming optical system for forming the image of the object on said detector means at a first magnification;

an optical member insertable into and retractable from an optical path of light travelling from the object to said detector means, insertion of said optical member into said optical path allowing the light from the object which has been passed through at least part of said optical member and said image forming optical system to form the image of the object on said detector means at a second magnification smaller than the first magnification, wherein said detector means produces a first electrical signal having a first signal level at the first magnification and produces a second electrical signal having a second signal level at the second magnification; and optical means for optically varying the amount of light incident on said detector means so as to make the first signal level to be approximately the same as the second signal level.

2. The position detection device according to claim 1, wherein said optical member comprises a half wave plate, wherein said detector means comprises two image forming elements.

3. The position detection device according to claim 1, wherein said optical member comprises a half wave plate, and said detection means comprising two image forming elements, said optical member and said image forming optical system forming the image of the object at said second magnification on a different image forming element from that at which the image is formed at said first magnification when said half wave plate is inserted into the optical path.

4. The position detection device according to claim 1, wherein said detector means has a first detection surface and a second detection surface, the image of the object being formed at said first magnification on said first detection surface and the image of the object being formed at said second magnification on said second detection surface.

5. The position detection device according to claim 4, wherein said image forming optical system is a polarization beam splitter which reflects light from the object to said second surface of said detector means when said half wave plate is inserted in the optical path.

6. The position detection device according to claim 4, wherein said image forming optical system comprises a polarization beam splitter, and wherein said optical member comprises a halfwave plate inserted in said optical path to receive light from the object before the light enters said polarization beam splitter.

7. A position detecting method for detecting a position of an object, said method comprising:
   a light generating step of generating light with a light source;
   an illumination step of introducing the light from the light source to the object with an illumination device;
   a first detection step of detecting the position of the object by forming an image of the object on detector means at a first magnification with an image forming optical system by photoelectrically converting the image of the object at the first magnification to a first electrical signal having a first signal level;
   the step of inserting an optical member into an optical path of the light travelling from the object to the detector means, the light from the object which has been passed through at least part of the optical member and the image forming optical system forming the image of the object on the detector means at a second magnification which is smaller than the first magnification;
   a second detection step of detecting the position of the object from the image of the object formed on the detector means at the second magnification by photoelectrically converting the image of the object at the second magnification to a second electrical signal having a second signal level; and
   optically varying the amount of light incident on the detector means in said first and second detection steps so that the first and second signal levels of the first and second electrical signals are approximately the same.

8. The position detection method according to claim 7, wherein said first detection step comprises the step of receiving light from the object with a polarization beams splitter, and transmitting the light from the object through the polarization beam splitter to a detection surface of the detector means.

9. The position detection method according to claim 7, wherein the optical member comprises a half wave plate, said second detecting step comprising the step of forming with the optical member and the image forming optical system the image of the object at the second magnification on a different detection surface from that at which the image is formed at the first magnification when the half wave plate is inserted into the optical path in said inserting step.

10. The position detection method according to claim 8, wherein said first detection step comprises the step of receiving light from the object with a polarization beam splitter, and transmitting the light from the object through the polarization beam splitter to a detection surface of the detector means.

11. The position detection method according to claim 1, wherein the detection means has a first detection surface and a second detection surface, wherein said first detection step comprises the step of forming the image of the object at the first magnification on the first detection surface, and wherein said second detection step comprises the step of forming the image of the object at the second magnification on the second detection surface.

12. The position detection method according to claim 11, wherein said first detection step comprises the step of receiving light from the object with a polarization beam splitter, and transmitting the light from the object through the polarization beam splitter to the first detection surface.

13. The position detection method according to claim 11, wherein said optical member is a half wave plate, wherein said inserting step comprises the step of transmitting light from the object to the detector means through the half wave plate.

14. The position detection method according to claim 11, wherein the image forming optical system has a polarization beam splitter, wherein said first detection step comprises the step of transmitting light from the object to the detector means through the polarization beam splitter, wherein the optical member comprises a halfwave plate, wherein said inserting step comprises the step of inserting the halfwave plate in the optical path on a side of said polarization beam splitter closer to the object.

15. An exposure apparatus for detecting a position of a mark formed on a wafer and for projecting a pattern on a reticle onto a wafer, said apparatus comprising:
   a working stage for supporting the wafer thereon;
   a light source for generating light;
   an illumination device for introducing the light from said light source to the mark;
   a detector for detecting the position of the object on the basis of a sensed optical image;
   an image forming optical system for forming the image of the mark on a detection surface of said detector at a first magnification;
   an optical member insertable into and retractable from an optical path of the light travelling from the mark to the detector, insertion of said optical member into said optical path allowing the light from the mark which has been passed through at least part of said optical member and said image forming optical system to form the image of the mark on said detection surface of said detector at a second magnification smaller than the first magnification;
   wherein said detector photoelectrically converts the sensed optical image at the first and second magnifications to first and second electrical signals, respectively, the first and second signals having first and second signal levels, respectively;
   optical means for varying the amount of light incident on said detector so as to make the first and second signal levels of the first and second signals approximately equal; and a control system controlling said working stage to move the wafer to a predetermined position on the basis of the position of the wafer obtained by said detector and transferring the pattern on the reticle onto the wafer.

16. An exposure method of detecting a position of a mark formed on a wafer and of projecting a pattern on a reticle onto the wafer, said method comprising:

a light generating step of generating light with a light source;

an illumination step of introducing the light from the light source to the mark with an illumination device;

a first detection step of detecting the position of the mark by forming an image of the mark on a detection surface of a detector at a first magnification with an image forming optical system and photoelectrically converting the mark image at the first magnification to a first electrical signal having a first signal level;

a step of inserting an optical member into an optical path of the light travelling from the mark to the detector, the light from the mark which has been passed through at least part of said optical member and said image forming optical system forming the image of the mark on said detection surface of said detector at a second magnification which is smaller than said first magnification;

a second detection step of detecting the position of the mark from the image of the mark formed on said detection surface of said detector at said second magnification and photoelectrically converting the mark image at the second magnification to a second electrical signal having a second signal level;

varying the amount of light incident on the detector in said first and second detection steps so that the first and second signal levels of the first and second electrical signals are approximately the same; and a step of moving the wafer to a predetermined position on the basis of a position of the wafer obtained in said first and second detection steps and of transferring the pattern on the reticle onto the wafer.

17. A position detection device for detecting a position of an object, said device comprising:

a light source for generating light;

an illuminating device introducing the light from said light source to the object;

detector means for detecting the position of the object on the basis of a sensed optical image;

an image forming optical system for forming the image of the object on said detector means at a first magnification;

first and second aperture stops, wherein the longitudinal axes of the apertures of said aperture stops are perpendicular to each other, wherein the image of the object passes through said first and second aperture stops before being detected by said detector means, wherein said detector means detects the position of the object in the X direction using one of said aperture stops and detects the position of the object in the Y direction using the other of the aperture stops;

an optical member insertable into and retractable from an optical path of light travelling from the object to said detector means, insertion of said optical member into said optical path allowing the light from the object which has been passed through at least part of said optical member and said image forming optical system to form the image of the object on said detector means at a second magnification smaller than the first magnification;

wherein said detector means photoelectrically converts the sensed optical image at the first and second magnifications to first and second electrical signals, respectively, the first and second signals having first and second signal levels, respectively; and optical means for varying the amount of light incident on said detector means so as to make the first and second signal levels of the first and second signals approximately equal.

18. A position detecting method for detecting a position of an object, said method comprising:

a light generating step of generating light with a light source;

an illuminating step of introducing the light from the light source to the object;

a first detection step of detecting the position of the object by forming an image of the object on detection means at a first magnification with an image forming optical system in the X direction by receiving the image through a first aperture stop, and in the Y direction by receiving the image through a second aperture stop by photoelectrically converting the image of the object at the first magnification to a first electrical signal at a first signal level, where the longitudinal axis of the first aperture of the first aperture stop is perpendicular to the longitudinal axis of the second aperture of the second aperture stop;

the step of inserting an optical member into an optical path of the light travelling from the object to the detector means, the light from the object which has been passed through at least part of the optical member and the image forming optical system forming the image of the object on the detector means at a second magnification which is smaller than the first magnification;

a second detection step of detecting the position of the object from the image of the object formed on the detector means at the second magnification by photoelectrically converting the image of the object at the second magnification to a second electrical signal of a second signal level; and varying the amount of light incident on the detector means so that the first and second signal levels are approximately equal.

19. An exposure apparatus for detecting a position of a mark formed on a wafer and for projecting a pattern on a reticle onto a wafer, said apparatus comprising:

a working stage for supporting the wafer thereon;

a light source for generating light;

an illumination device for introducing the light from said light source to the mark;

detector means for detecting the position of the object on the basis of a sensed optical image;

an image forming optical system for forming the image of the mark on said detector means at a first magnification;

first and second aperture stops, wherein the longitudinal axes of the apertures of the aperture stops are perpendicular to each other, wherein the image of the object passes through said first and second aperture stops before being detected by said detector means, wherein said detector means detects the position of the object in the X direction using one of said aperture stops and detects the position of the object in the Y direction using the other of the aperture stops;

an optical member insertable into and retractable from an optical path of the light travelling from the mark to said detector means, insertion of said optical member into said optical path allowing the light from the mark which has been passed through at least part of said optical member and said image forming optical system to form the image of the mark on said detection surface of said detector means at a second magnification smaller than the first magnification;

wherein said detector means photoelectrically converts the sensed optical image at the first and second magnifications to first and second electrical signals, respectively, the first and second signals having first and second signal levels, respectively;

optical means for varying the amount of light incident on said detector means so as to make the first and second signal levels of the first and second signals approximately equal; and a control system controlling said working stage to move the wafer to a predetermined position on the basis of the position of the wafer obtained by said detector means and to transfer the pattern on the reticle onto the wafer.

20. An exposure method of detecting a position of a mark formed on a wafer and of projecting a pattern on a reticle onto the wafer, said method comprising:

a light generating step of generating light with a light source;

an illumination step of introducing the light from the light source to the mark;

a first detection step of detecting the position of the mark by forming an image of the mark on a detection surface of detector means at a first magnification with an image forming optical system in the X direction by receiving the image through a first aperture stop, and in the Y direction by receiving the image through a second aperture stop by photoelectrically converting the image of the mark to a first electrical signal having a first signal level, where the longitudinal axis of the first aperture of the first aperture stop is perpendicular to the longitudinal axis of the second aperture of the second aperture stop;

a step of inserting an optical member into an optical path of the light travelling from the mark to the detector means, the light from the mark which has been passed through at least part of the optical member and said image forming optical system forming the image of the mark on the detector means at a second magnification which is smaller than said first magnification;

a second detection step of detecting the position of the mark from the image of the mark formed on the detector means at said second magnification by photoelectrically converting the image of the mark at the second magnification to a second electrical signal having a second signal level;

varying the amount of light incident on the detector means so that the first and second signal levels are approximately the same; and a step of moving the wafer to a predetermined position on the basis of a position of the wafer obtained in said first and second detection steps and of transferring the pattern on the reticle onto the wafer.

* * * * *

UNITED STATES PATENT AND TRADEMARK OFFICE
CERTIFICATE OF CORRECTION

PATENT NO. : 5,790,258

DATED : August 4, 1998

INVENTOR(S) : Noriyuki MITOME, et al.

It is certified that error appears in the above-identified patent and that said Letters Patent is hereby corrected as shown below:

COLUMN 1:

Line 12, "devices" should be deleted.

COLUMN 3:

Line 34, "comprise" should read --comprises--.

COLUMN 4:

Line 54, "devices" should be deleted.

COLUMN 8:

Line 27, "15a" should read --15a.--.

COLUMN 10:

Line 9, "La" should read --$L_a$--.

UNITED STATES PATENT AND TRADEMARK OFFICE
CERTIFICATE OF CORRECTION

PATENT NO. : 5,790,258

DATED : August 4, 1998

INVENTOR(S) : Noriyuki MITOME, et al.

It is certified that error appears in the above-identified patent and that said Letters Patent is hereby corrected as shown below:

COLUMN 12:

Line 7, "claim 8," should read --claim 9,--.
Line 13, "claim 1," should read --claim 7,--.

Signed and Sealed this

Twentieth Day of April, 1999

Attest:

Q. TODD DICKINSON

Attesting Officer

Acting Commissioner of Patents and Trademarks